US012224389B2

(12) United States Patent
Kitahama et al.

(10) Patent No.: US 12,224,389 B2
(45) Date of Patent: Feb. 11, 2025

(54) LIGHT-EMITTING ELEMENT INCLUDING A REFLECTIVE PORTION HAVING A FIRST, SECOND, AND THIRD LAYER

(71) Applicant: NICHIA CORPORATION, Anan (JP)

(72) Inventors: Shun Kitahama, Tokushima (JP); Yusuke Minato, Itano-gun (JP)

(73) Assignee: NICHIA CORPORATION, Anan (JP)

(*) Notice: Subject to any disclaimer, the term of this patent is extended or adjusted under 35 U.S.C. 154(b) by 301 days.

(21) Appl. No.: 17/466,680

(22) Filed: Sep. 3, 2021

(65) Prior Publication Data

US 2022/0077365 A1 Mar. 10, 2022

(30) Foreign Application Priority Data

Sep. 7, 2020 (JP) ................................. 2020-150139

(51) Int. Cl.
*H01L 33/60* (2010.01)
*H01L 33/14* (2010.01)
*H01L 33/38* (2010.01)
*H01L 33/10* (2010.01)

(52) U.S. Cl.
CPC ............ *H01L 33/60* (2013.01); *H01L 33/145* (2013.01); *H01L 33/382* (2013.01); *H01L 33/10* (2013.01)

(58) Field of Classification Search
CPC ......... H01L 33/38; H01L 33/46; H01L 33/42; H01L 33/405; H01L 33/10; H01L 33/145; H01L 33/382; H01L 33/60
USPC ............... 257/13, 98, 99, E33.055, E33.072
See application file for complete search history.

(56) References Cited

U.S. PATENT DOCUMENTS

| 2009/0146165 A1* | 6/2009 | Hasnain | H01L 33/46 438/32 |
| 2011/0037092 A1* | 2/2011 | Hori | H01L 33/405 257/98 |
| 2011/0084294 A1* | 4/2011 | Yao | H01L 33/62 257/E33.03 |
| 2012/0146075 A1 | 6/2012 | Deguchi | |
| 2013/0181244 A1* | 7/2013 | Sato | H01L 33/405 257/98 |

(Continued)

FOREIGN PATENT DOCUMENTS

| JP | 2011-138820 A | 7/2011 |
| JP | 2012-124306 A | 6/2012 |

(Continued)

*Primary Examiner* — David Chen
(74) *Attorney, Agent, or Firm* — Foley & Lardner LLP

(57) ABSTRACT

A light-emitting element includes: a semiconductor layered structure including a first semiconductor layer of a first conductivity type, a second semiconductor layer of a second conductivity type, and an active layer located between the first semiconductor layer and the second semiconductor layer; a reflective portion including an insulative first layer located on the first semiconductor layer, a second layer made of a metal material located on the first layer, and a third layer located on the second layer; an insulative layer covering the reflective portion; a light-transmissive conductive layer located on the insulative layer and on the first semiconductor layer; a first electrode located on a portion of the light-transmissive conductive layer that is above the reflective portion; and a second electrode located on the second semiconductor layer.

14 Claims, 4 Drawing Sheets

(56) References Cited

U.S. PATENT DOCUMENTS

| | | | |
|---|---|---|---|
| 2014/0231839 A1* | 8/2014 | Jeon | H01L 33/382 |
| | | | 257/96 |
| 2015/0364653 A1* | 12/2015 | Chae | H01L 33/38 |
| | | | 257/98 |
| 2017/0186918 A1 | 6/2017 | Kondo | |
| 2017/0263816 A1 | 9/2017 | Yang et al. | |
| 2018/0198023 A1 | 7/2018 | Kim et al. | |

FOREIGN PATENT DOCUMENTS

| | | |
|---|---|---|
| JP | 2012-124321 A | 6/2012 |
| JP | 2015-065280 A | 4/2015 |
| JP | 2017-118031 A | 6/2017 |
| JP | 2018-113442 A | 7/2018 |

* cited by examiner

LIGHT-EMITTING ELEMENT INCLUDING A REFLECTIVE PORTION HAVING A FIRST, SECOND, AND THIRD LAYER

CROSS REFERENCE TO RELATED APPLICATION

This application claims priority to Japanese Patent Application No. 2020-150139, filed on Sep. 7, 2020, the disclosure of which is hereby incorporated by reference in its entirety.

BACKGROUND

1. Technical Field

The present disclosure relates to a light-emitting element.

2. Description of the Related Art

Japanese Patent Publication No. 2018-113442 describes a light-emitting element including a first electrode that is electrically connected to a first conductivity-type semiconductor layer, and a second electrode that is located on a transparent electrode layer provided on a second conductivity-type semiconductor layer and is electrically connected to the transparent electrode layer. The publication discloses a structure in which the second electrode includes a second electrode pad and a second electrode extended portion that is an extension from the second electrode pad, wherein a second reflective layer is provided between the second electrode and the transparent electrode layer to improve the light extraction efficiency.

SUMMARY

With such a light-emitting element, it is desirable to have a higher output power and a higher reliability. It is an object of the present disclosure to provide a light-emitting element having a higher output power and a higher reliability.

A light-emitting element according to one embodiment of the present disclosure includes: a semiconductor layered structure including a first semiconductor layer of a first conductivity type, a second semiconductor layer of a second conductivity type, and an active layer located between the first semiconductor layer and the second semiconductor layer; a reflective portion including an insulative first layer provided on the first semiconductor layer, a second layer made of a metal material provided on the first layer, and a third layer provided on the second layer; an insulative layer provided covering the reflective portion; a light-transmissive conductive layer provided on the insulative layer and on the first semiconductor layer; a first electrode provided on the light-transmissive conductive layer located above the reflective portion; and a second electrode provided on the second semiconductor layer.

According to certain embodiments of the present disclosure, it is possible to provide a light-emitting element having a higher output power and a higher reliability.

DETAILED DESCRIPTION

Figure 1:
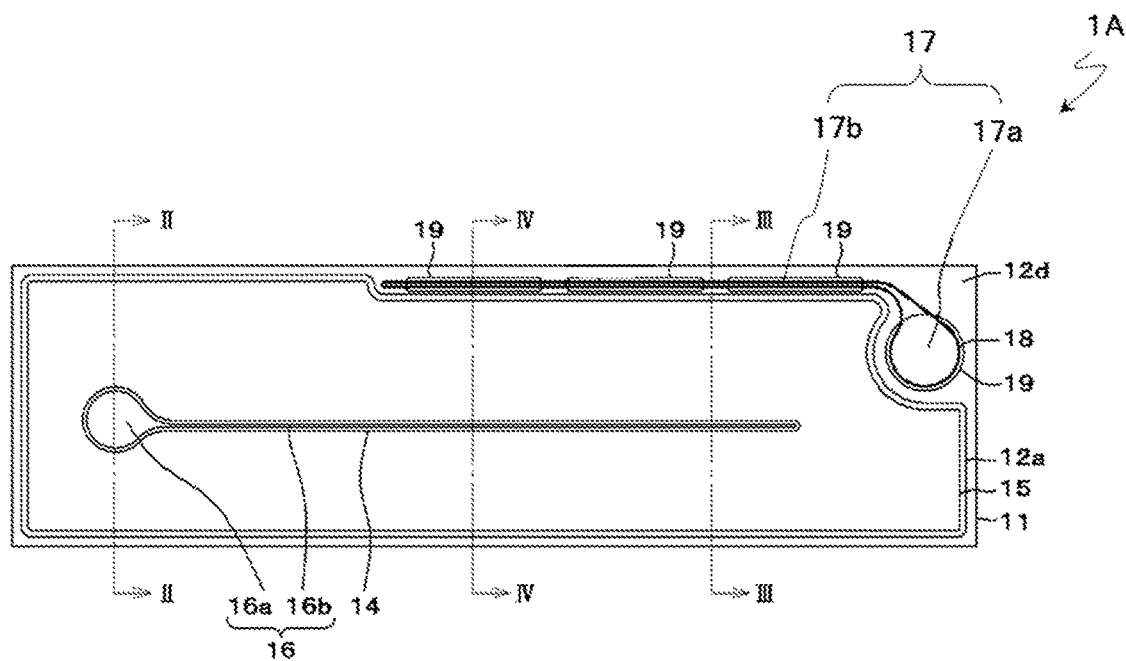
FIG. 1 is a top view schematically showing a configuration of a light-emitting element according to a first embodiment.

Embodiments of the light-emitting element according to the present disclosure will now be described. Note that the figures referred to in the following description are schematic representations in which the scale, interval, positional relationship, etc., of and between various members may be exaggerated. Some members may be omitted in some figures. Also, the scale and interval of and between various members may not be consistent between a plan view and a cross-sectional view thereof. Moreover, in the following description, like nomenclatures and like reference characters basically denote the same or similar members, for which detailed description will not be repeated.

As used herein, terms such as "on", "above", "upper" and "below" are intended merely to denote relative positions between components in the figures referred to in the description.

First Embodiment

A light-emitting element 1A according to the present embodiment includes: a semiconductor layered structure 12 including a first semiconductor layer 12a of the first conductivity type, a second semiconductor layer 12b of the second conductivity type, and an active layer 12c located between the first semiconductor layer 12a and the second semiconductor layer 12b; a reflective portion 13 including an insulative first layer 13a provided on the first semiconductor layer 12a, a second layer 13b made of a metal material provided on the first layer 13a, and a third layer 13c provided on the second layer 13b; an insulative layer 14 provided covering the reflective portion 13; a light-transmissive conductive layer 15 provided on the insulative layer 14 and on the first semiconductor layer 12a; a first electrode 16 provided on the light-transmissive conductive layer 15 located above the reflective portion 13; and a second electrode 17 provided on the second semiconductor layer 12b.

Figure 2:
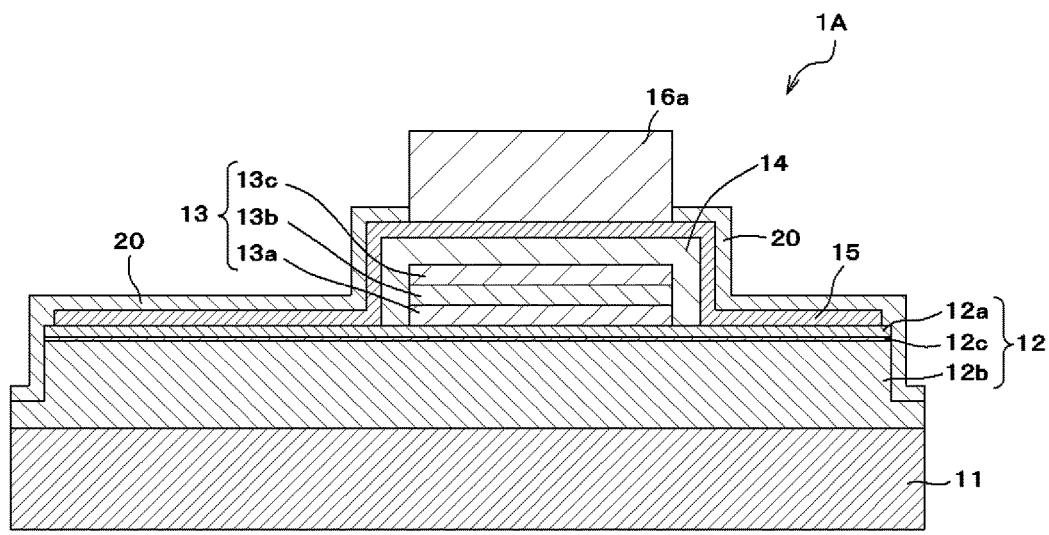
FIG. 2 is a schematic cross-sectional view taken along line II-II of FIG. 1.
Figure 3:
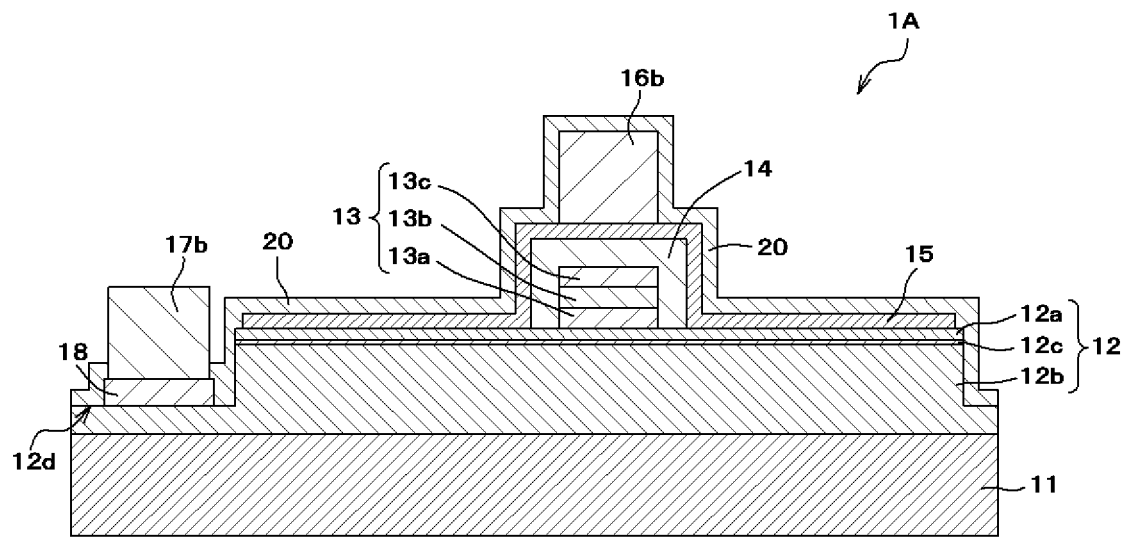
FIG. 3 is a schematic cross-sectional view taken along line III-III of FIG. 1.
Figure 4:
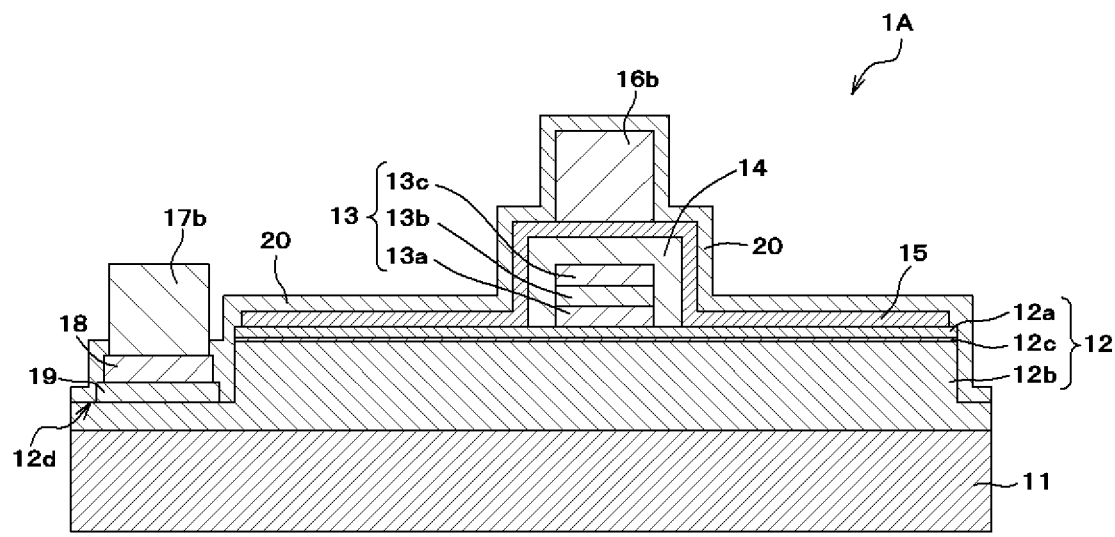
FIG. 4 is a schematic cross-sectional view taken along line IV-IV of FIG. 1.

Referring now to FIG. 1 to FIG. 4, the light-emitting element 1A of the present embodiment will be described in detail. FIG. 1 is a top view schematically showing a configuration of the light-emitting element 1A according to the first embodiment. FIG. 2 is a schematic cross-sectional view taken along line II-II of FIG. 1. FIG. 3 is a schematic cross-sectional view taken along line III-III of FIG. 1. FIG. 4 is a schematic cross-sectional view taken along line IV-IV of FIG. 1.

(Substrate)

A substrate 11 is for supporting the semiconductor layered structure 12. The substrate 11 may be a growth substrate used for epitaxial growth of the semiconductor layered structure 12. The substrate 11 may be a sapphire ($Al_2O_3$)

substrate in a case where a nitride semiconductor is used for the semiconductor layered structure 12, for example.

(Semiconductor Layered Structure)

As shown in FIG. 2 to FIG. 4, the semiconductor layered structure 12 is formed on the upper surface of the substrate 11. The semiconductor layered structure 12 includes the first semiconductor layer 12a of the first conductivity type, the second semiconductor layer 12b of the second conductivity type, and the active layer 12c located between the first semiconductor layer 12a and the second semiconductor layer 12b. The first conductivity type is the p type or the n type. The second conductivity type is a conductivity type, i.e., the p type or the n type, that is different from the first conductivity type. In the present embodiment, the first conductivity type is the p type, and the second conductivity type is the n type. Light is emitted from the active layer 12c by applying a voltage between the first electrode 16 provided on the first semiconductor layer 12a and the second electrode 17 provided on the second semiconductor layer 12b.

The semiconductor layered structure 12 includes an exposed portion 12d where the first semiconductor layer 12a and the active layer 12c are partially absent, i.e., a depression from the surface of the first semiconductor layer 12a such that the second semiconductor layer 12b is exposed upward through the first semiconductor layer 12a.

As shown in FIG. 1, the semiconductor layered structure 12 includes the exposed portion 12d extending along the periphery of the light-emitting element 1A in a top plan view. In a top plan view, the exposed portion 12d is provided in an area that extends along the short side and the long side of the light-emitting element 1A. The second electrode 17 is provided in a portion of the exposed portion 12d extending along the long side of the light-emitting element 1A.

The first semiconductor layer 12a, the second semiconductor layer 12b and the active layer 12c comprise a nitride semiconductor such as $In_xAl_yGa_{1-x-y}N$ ($0 \leq X$, $0 \leq Y$ and $X+Y<1$). For example, the semiconductor layered structure 12 may be made of a nitride semiconductor.

(Reflective Portion)

As shown in FIG. 2 to FIG. 4, the reflective portion 13 includes the insulative first layer 13a provided on the first semiconductor layer 12a, the second layer 13b made of a metal material provided on the first layer 13a, and the third layer 13c provided on the second layer 13b. The reflective portion 13 is provided between the first electrode 16 and the first semiconductor layer 12a. This makes it harder for a current to flow in the area directly below the first electrode 16, thus suppressing light emission in the area, thereby reducing light absorption by the first electrode 16. Moreover, it is possible to increase the current to flow in the first semiconductor layer 12a located in a region other than directly below the reflective portion 13, thereby realizing efficient light emission from the light-emitting element 1A.

The first layer 13a is in contact with the first semiconductor layer 12a. It is preferred that the first layer 13a is light-transmissive, has a lower refractive index than the first semiconductor layer 12a, and has a large refractive index difference from the first semiconductor layer 12a. Thus, at the interface between the first semiconductor layer 12a and the first layer 13a, light travelling from the active layer 12c toward the first layer 13a can be effectively reflected based on the refractive index difference and the Snell's law. This allows for reducing light t absorption by the first electrode 16, thereby improving the light extraction efficiency. The first layer 13a may be a silicon oxide film ($SiO_2$) or a silicon oxynitride film (SiON), for example. For example, when a nitride semiconductor is used for the first semiconductor layer 12a, $SiO_2$ is used as the first layer 13a.

The thickness of the first layer 13a may be set to be 80 nm or more and 300 nm or less, for example. By setting the thickness of the first layer 13a to 80 nm or more, it is possible to realize effective reflection at the interface between the first layer 13a and the first semiconductor layer 12a. By setting the thickness of the first layer 13a to 300 nm or less, it is possible to prevent the thickness of the reflective portion 13 including the first layer 13a from being too large, and to prevent breaking of the light-transmissive conductive layer 15 formed on the reflective portion 13. As used herein, the thickness of a member refers to the maximum thickness of the member in a cross-sectional view.

The second layer 13b is provided covering the upper surface of the first layer 13a. With the provision of the second layer 13b, light that passes through the first layer 13a without being reflected at the interface between the first layer 13a and the first semiconductor layer 12a can be reflected by means of the second layer 13b toward the first semiconductor layer 12a. This allows for improving the light extraction efficiency as compared with a case where the reflective portion 13 does not include the second layer 13b.

The second layer 13b is preferably made of a metal material having a high reflectivity for the peak wavelength of light from the active layer 12c. The second layer 13b comprises a metal material having a reflectivity of 70% or more, preferably 80% or more, for the peak wavelength of light from the active layer 12c, for example. The second layer 13b may comprise Al or Ag or an alloy including such a metal material, for example. The second layer may be made of Al, Ag or an alloy including Al or Ag as its primary component In view of suppressing dissolution of the second layer 13b to be described below, it is preferred to use AlCu, which has a better corrosion resistance than Al, as the second layer 13b. The thickness of the second layer 13b may be set to be 80 nm or more and 120 nm or less, for example.

The third layer 13c is provided covering the upper surface of the second layer 13b. With the provision of the third layer 13c, it is possible to suppress deterioration, e.g., oxidation, of the surface of the second layer 13b, and to prevent the reflectivity of the second layer 13b from lowering. The second layer 13b may possibly dissolve in a solution used in patterning, etc., in the step of forming the reflective portion 13 or in the step of forming the insulative layer 14. However, in the present embodiment, since the second layer 13b is covered by the third layer 13c, it is possible to suppress dissolution of the second layer 13b, and it is possible to further increase the reliability of the light-emitting element 1A.

The third layer 13c is preferably made of a light-transmissive insulative material. The third layer 13c may comprise $SiO_2$ or SiON, for example. The thickness of the third layer 13c may be set to be 80 nm or more and 120 nm or less, for example. In view of improving the moisture resistance of the third layer 13c, it is preferred to use SiON as the third layer 13c.

The thickness of the reflective portion 13 is preferably set to 250 nm or more and 400 nm or less, for example. By setting the thickness of the reflective portion 13 to 250 nm or more, it is easier to realize the functions of different layers of the reflective portion 13 described above, and it is possible to increase the output power and the reliability of the light-emitting element 1A. By setting the thickness of the reflective portion 13 to be 400 nm or less, it is easier to prevent breaking of the light-transmissive conductive layer 15 formed to cover the area above the reflective portion 13, and it is possible to increase the reliability of the light-emitting element 1A.

(Insulative Layer)

As shown in FIG. 2 to FIG. 4, the insulative layer 14 is provided covering the reflective portion 13. With this structure, it is possible to prevent the reflective portion 13 and the light-transmissive conductive layer 15 from contacting each other, and it is possible to further increase the reliability of the light-emitting element 1A. The insulative layer 14 is preferably made of a light-transmissive insulative material, for example. The insulative layer 14 may comprise $SiO_2$ or SiON, for example. In view of preventing moisture, etc., from entering the reflective portion 13, it is preferred to use SiON having a higher moisture resistance as the insulative layer 14. The thickness of the insulative layer 14 is larger than a thickness of the first layer 13a.

(Light-Transmissive Conductive Layer)

As shown in FIG. 1 to FIG. 4, the light-transmissive conductive layer 15 is provided on the insulative layer 14 and on the first semiconductor layer 12a. The light-transmissive conductive layer 15 is electrically connected to the first semiconductor layer 12a. A portion of the light-transmissive conductive layer 15 is provided between the first electrode 16 and the reflective portion 13. The light-transmissive conductive layer 15 covers substantially the entire surface of the upper surface of the first semiconductor layer 12a, so that it is possible to diffuse the current supplied to the first electrode 16 over a wider area of the first semiconductor layer 12a.

The light-transmissive conductive layer 15 is preferably made of a conductive metal oxide. The light-transmissive conductive layer 15 may comprise an oxide that includes at least one element selected from the group consisting of Zn, In, Sn, Ga and Ti, for example. The light-transmissive conductive layer 15 may comprise ITO or Zno, for example. ITO and Zno have a high light-transmissive for visible light and have a high conductivity, and therefore are suitable materials for covering substantially the entire surface of the upper surface of the first semiconductor layer 12a.

In view of suppressing light absorption by the light-transmissive conductive layer 15, the light-transmissive conductive layer 15 preferably has a smaller thickness. The thickness of the light-transmissive conductive layer 15 may be 30 nm or more and 100 nm or less, preferably 35 nm or more and 80 nm or less, for example.

(First Electrode)

As shown in FIG. 1 to FIG. 4, the first electrode 16 is provided on the light-transmissive conductive layer 15 located above the reflective portion 13. The first electrode 16 may be provided on a portion of the light-transmissive conductive layer 15 located above the reflective portion 13. With such an arrangement of the first electrode 16, a portion of light travelling from the active layer 12c toward the first electrode 16 can be reflected by the reflective portion 13, thereby suppressing light absorption by the first electrode 16, and it is therefore possible to increase the output power of the light-emitting element 1A. At least a portion of the reflective portion 13 may be located between the first electrode 16 and the active layer 12c. The first electrode 16 is electrically connected to the first semiconductor layer 12a with the light-transmissive conductive layer 15 therebetween. The first electrode 16 includes a first connecting portion 16a and a first extended portion 16b that is an extension from the first connecting portion 16a. The reflective portion 13 is provided between the first connecting portion 16a and the first semiconductor layer 12a, and between the first extended portion 16b and first semiconductor layer 12a. This allows for suppressing light absorption by the first connecting portion 16a and the first extended portion 16b, and it is therefore possible to further increase the output power of the light-emitting element 1A. The first electrode 16 may at least partially overlap with the reflective portion 13 via the light-transmissive conductive layer 15. The first electrode 16 is preferably provided in the area where the reflective portion 13 is disposed in a top plan view. Thus, light travelling toward the first electrode 16 can be efficiently reflected by the reflective portion 13, and it is possible to improve the light extraction efficiency.

The first connecting portion 16a is an area used for external connection by wire bonding, or the like. The first connecting portion 16a has a generally circular shape in a top plan view as shown in FIG. 1. The first extended portion 16b is an auxiliary electrode for efficiently diffusing the current supplied through the first connecting portion 16a to the light-transmissive conductive layer 15. The width of the first extended portion 16b is smaller than the width of the first connecting portion 16a in a top plan view.

The first connecting portion 16a of the first electrode 16 may comprise Cu or Au or an alloy including such a metal as its primary component, for example, so as to be suitable for external connection by wire bonding, or the like. Note that the first connecting portion 16a and the first extended portion 16b of the first electrode 16 may be made of the same material.

(Second Electrode)

As shown in FIG. 1 to FIG. 4, the second electrode 17 is provided on the second semiconductor layer 12b. The second electrode 17 is provided in a portion of the exposed portion 12d of the second semiconductor layer 12b. As shown in FIG. 3, a contact electrode 18 is provided between the second electrode 17 and the second semiconductor layer 12b. The contact electrode 18 is in contact with the second semiconductor layer 12b. The second electrode 17 is electrically connected to the second semiconductor layer 12b with the contact electrode 18 therebetween. The second electrode 17 may comprise Cu or Au or an alloy including such a metal as its primary component, for example, so as to be suitable for external connection by wire bonding, or the like. The contact electrode 18 may comprise a metal material having a high reflectivity for the peak wavelength of light from the active layer 12c so that the contact electrode 18 reflects light from the active layer 12c. The contact electrode 18 may comprise Al or Ag or an alloy including such a metal material as its primary component, for example.

As shown in FIG. 1, the second electrode 17 includes a second connecting portion 17a and a second extended portion 17b that is an extension from the second connecting portion 17a. The second connecting portion 17a is an area used for external connection by wire bonding, or the like. The second connecting portion 17a is provided in the vicinity of the short side of the light-emitting element 1A. The second connecting portion 17a has a generally circular shape in a top plan view. The second extended portion 17b is an auxiliary electrode for efficiently diffusing the current supplied through the second connecting portion 17a to the second semiconductor layer 12b. The second extended portion 17b is provided so as to extend along the long side of the light-emitting element 1A. The width of the second extended portion 17b is smaller than the width of the second connecting portion 17a in a top plan view. Note that the second connecting portion 17a and the second extended portion 17b of the second electrode 17 may be made of the same material.

As shown in FIG. 1 to FIG. 4, a plurality of insulative portions 19 are provided in the exposed portion 12d of the second semiconductor layer 12b. The insulative portions 19 are provided between the second connecting portion 17a and the first semiconductor layer 12a. The contact electrode 18 and the second extended portion 17b are provided on the insulative portion 19 and on the second semiconductor layer 12b. As shown in FIG. 3, in an area where the insulative portion 19 is absent, the contact electrode 18 is in contact with the second semiconductor layer 12b. As shown in FIG. 4, in an area where the insulative portion 19 is provided, the contact electrode 18 is not in contact with the second semiconductor layer 12b. That is, the contact electrode 18 is intermittently connected to the second semiconductor layer 12b. Thus, the current supplied to the second connecting portion 17a can be diffused, via the second extended portion 17b, over a wider range of the second semiconductor layer 12b.

(Protection Layer)

A protection layer 20 covers substantially the entire upper surface of the light-emitting element 1A. As shown in FIG. 2 to FIG. 4, the protection layer 20 has an opening through which a portion of the light-transmissive conductive layer 15 located above the reflective portion 13 is exposed, and the first connecting portion 16a of the first electrode 16 is provided in the opening. The protection layer 20 also includes an opening through which the contact electrode 18 is exposed. The second electrode 17 is provided in the opening. The protection layer 20 preferably comprises a material that is light-transmissive and insulative. The protection layer 20 may comprise $SiO_2$ or SiON, for example.

Second Embodiment

Figure 5:
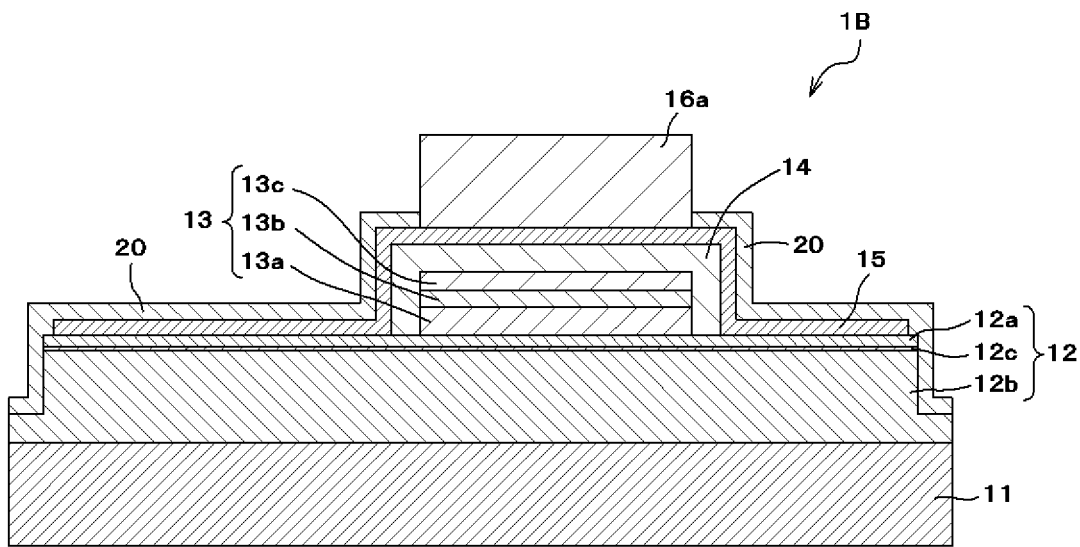
FIG. 5 is a cross-sectional view schematically showing a configuration of a light-emitting element according to a second embodiment.

A light-emitting element 1B according to the second embodiment will now be described with reference to FIG. 5. The first layer 13a, the second layer 13b and the third layer 13c are formed with the same thickness in the first embodiment described above, whereas the thickness of the first layer 13a is larger than the second layer 13b and the third layer 13c in the present embodiment, which is the primary difference from the first embodiment. FIG. 5 is a schematic cross-sectional view taken along line II-II of FIG. 1.

In the present embodiment, as shown in FIG. 5, the thickness of the first layer 13a is larger than the thickness of the third layer 13c. Thus, total reflection at the interface between the first layer 13a and the first semiconductor layer 12a is more likely to occur, and it is therefore possible to improve the light extraction efficiency, thereby further increasing the output power of the light-emitting element 1B. The thickness of the first layer 13a is twice or more and three times or less of the thickness of the third layer 13c. Specifically, the thickness of the first layer 13a is preferably set to 200 nm or more and 400 nm or less.

The thickness of the second layer 13b and the thickness of the third layer 13c are each preferably smaller than the thickness of the first layer 13a. Therefore, the thickness of the reflective portion 13 can be made smaller as compared with a case where the first layer 13a, the second layer 13b and the third layer 13c have the same thickness. By decreasing the thickness of the reflective portion 13, it is easier to prevent breaking of the light-transmissive conductive layer 15, which is formed covering the area above the reflective portion 13, and it is possible to increase the reliability of the light-emitting element 1B.

Third Embodiment

Figure 6:
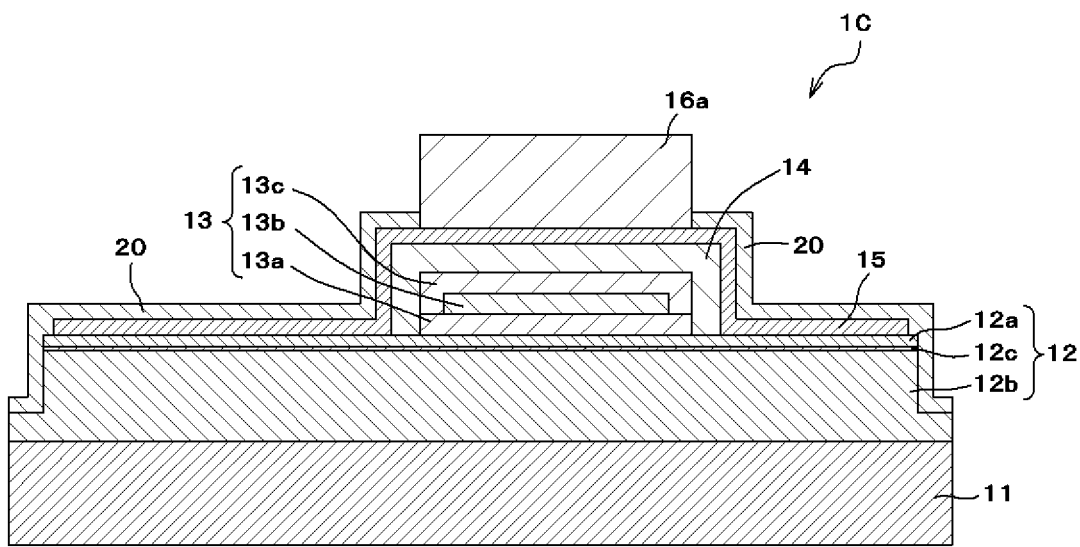
FIG. 6 is a cross-sectional view schematically showing a configuration of a light-emitting element according to a third embodiment.

A light-emitting element 1C according to the third embodiment will now be described with reference to FIG. 6. The first layer 13a, the second layer 13b and the third layer 13c are formed with the same width in a cross-sectional view in the first embodiment described above, whereas the width of the second layer 13b is smaller than the width of the third layer 13c in the present embodiment, which is the primary difference from the first embodiment. FIG. 6 is a schematic cross-sectional view taken along line II-II of FIG. 1.

As shown in FIG. 6, the width of the second layer 13b is smaller than the width of the third layer 13c in a cross-sectional view. The end portion of the third layer 13c is in contact with the first layer 13a. Thus, the end portion of the second layer 13b is covered by the third layer 13c, and the second layer 13b is unlikely to be exposed through the third layer 13c. This prevents degradation or deterioration of the second layer 13b, and it is possible to further increase the reliability of the light-emitting element 1C. The width of the second layer 13b is preferably set to 70% or more and 90% or less of the width of the third layer 13c, for example. By setting the width of the second layer 13b to 70% or more of the width of the third layer 13c, it is easier to realize the light-reflecting effect of the second layer 13b. By setting the width of the second layer 13b to 90% or less of the width of the third layer 13c, the end portion of the second layer 13b is likely to be covered by the third layer 13c.

Fourth Embodiment

Figure 7:
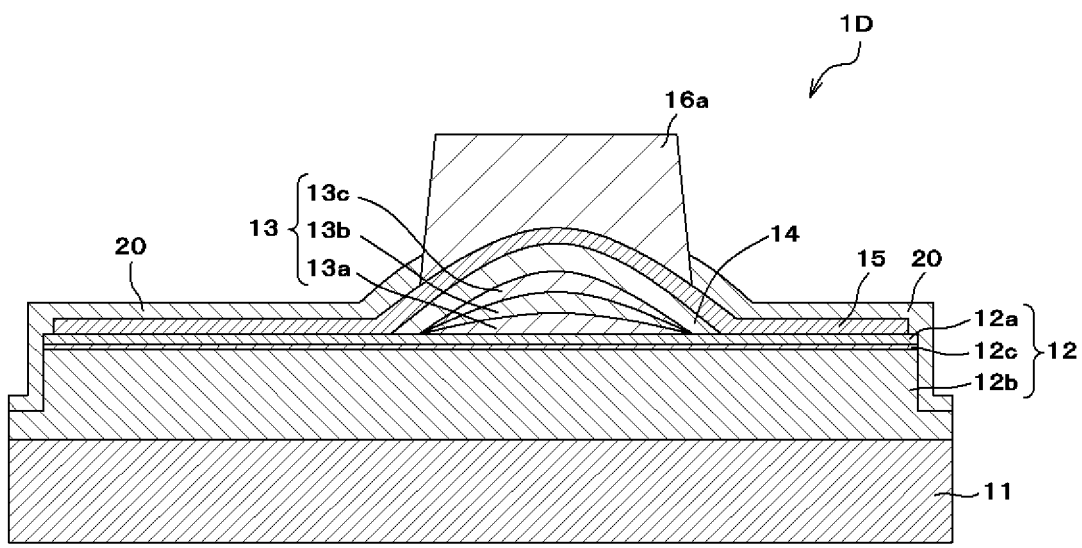
FIG. 7 is a cross-sectional view schematically showing a configuration of a light-emitting element according to a fourth embodiment.

A light-emitting element 1D according to the fourth embodiment will now be described with reference to FIG. 7. The first layer 13a, the second layer 13b and the third layer 13c are formed that have the same thickness in the end portion and in the central portion in the first embodiment described above, whereas the first layer 13a, the second layer 13b and the third layer 13c are formed so that the thickness thereof in the end portion is different from the thickness thereof in the central portion in the present embodiment, which is the primary difference from the first embodiment. FIG. 7 is a schematic cross-sectional view taken along line II-II of FIG. 1.

As shown in FIG. 7, the first layer 13a, the second layer 13b and the third layer 13c are formed so that the thickness of the end portion is smaller than the thickness of the central portion in a cross-sectional view. By forming the second layer 13b so that the thickness of the end portion is smaller than the thickness of the central portion, the end portion of the second layer 13b is likely to be covered by the third layer 13c without decreasing the width of the second layer 13b in a cross-sectional view. Therefore, it is possible to improve the light extraction efficiency while preventing degradation or deterioration of the second layer 13b, and it is possible to provide the light-emitting element 1D having a high reliability and a high output power.

While embodiments of a light-emitting element of the present invention have been described above in detail, the scope of the present invention is not bound by the description herein, but rather should be construed broadly based on the appended claims. It should be understood that any of various changes and modifications based on the description herein shall fall within the scope of the present invention.

The light-emitting element of the present disclosure can suitably be used in various types of light sources, e.g., backlight light sources of liquid crystal display devices, various lighting apparatuses and large-sized display devices.

What is claimed is:

1. A light-emitting element comprising:
   a semiconductor layered structure comprising a first semi-
   conductor layer of a first conductivity type, a second semiconductor layer of a second conductivity type, and an active layer located between the first semiconductor layer and the second semiconductor layer;

a reflective portion comprising an insulative first layer located on the first semiconductor layer, a second layer made of a metal material located on the first layer, and a third layer made of an insulative material located on the second layer, wherein a width of the second layer is less than a width of the third layer in a cross-sectional view, and an end portion of the third layer is in contact with a surface of the first layer that is not covered by the second layer;

an insulative layer covering the reflective portion;

a light-transmissive conductive layer located on the insulative layer and on the first semiconductor layer;

a first electrode located on a portion of the light-transmissive conductive layer that is above the reflective portion;

a second electrode located on the second semiconductor layer; and an insulative portion located between the second electrode and the second semiconductor layer; wherein:

the insulative portion is in contact with the second electrode and the second semiconductor layer at a region below the second electrode; and a thickness of the reflective portion is greater than a thickness of the insulative portion.

2. The light-emitting element according to claim 1, wherein:

the first electrode includes a first connecting portion and a first extended portion that extends from the first connecting portion; and the reflective portion is located between the first connecting portion and the first semiconductor layer, and between the first extended portion and the first semiconductor layer.

3. The light-emitting element according to claim 1, wherein an end portion of the second layer is covered by the third layer.

4. The light-emitting element according to claim 2, wherein an end portion of the second layer is covered by the third layer.

5. The light-emitting element according to claim 1, wherein a thickness of the insulative layer is larger than a thickness of the first layer.

6. The light-emitting element according to claim 2, wherein a thickness of the insulative layer is larger than a thickness of the first layer.

7. The light-emitting element according to claim 1, wherein:

the first layer is made of a silicon oxide film; and the insulative layer is made of a silicon oxynitride film.

8. The light-emitting element according to claim 2, wherein:

the first layer is made of a silicon oxide film; and the insulative layer is made of a silicon oxynitride film.

9. The light-emitting element according to claim 1, wherein the second layer is made of Al, Ag or an alloy including Al or Ag as its primary component.

10. The light-emitting element according to claim 2, wherein the second layer is made of Al, Ag or an alloy including Al or Ag as its primary component.

11. The light-emitting element according to claim 1, wherein a thickness of the reflective portion is 250 nm or more and 400 nm or less.

12. The light-emitting element according to claim 1, wherein the insulative layer is in contact with the first layer and the third layer, and the insulative layer is not in contact with the second layer.

13. The light-emitting element according to claim 1, wherein a number of layers of the reflective portion is greater than a number of layers of the insulative portion.

14. The light-emitting element according to claim 1, further comprising a protection layer located on the light-transmissive conductive layer and contacting a lateral surface of the first semiconductor layer.

* * * * *